US007332259B2

(12) United States Patent
Takagi

(10) Patent No.: US 7,332,259 B2
(45) Date of Patent: Feb. 19, 2008

(54) ALUMINUM SUPPORT FOR PLANOGRAPHIC PRINTING PLATE, ITS MANUFACTURING PROCESS, AND PLANOGRAPHIC PRINTING PLATE MATERIAL

(75) Inventor: Hiroshi Takagi, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 60 days.

(21) Appl. No.: 11/102,311

(22) Filed: Apr. 8, 2005

(65) Prior Publication Data

US 2005/0233250 A1 Oct. 20, 2005

(30) Foreign Application Priority Data

Apr. 20, 2004 (JP) ............................ 2004-123885

(51) Int. Cl.
*G03F 7/00* (2006.01)

(52) U.S. Cl. .................... 430/270.1; 430/302; 205/214

(58) Field of Classification Search ............. 430/270.1, 430/302; 205/214

See application file for complete search history.

(56) References Cited

U.S. PATENT DOCUMENTS 3,293,088 A * 12/1966 Wagner et al. .............. 148/248
4,153,461 A * 5/1979 Berghauser et al. ........ 430/160
4,448,647 A * 5/1984 Gillich et al. ................. 205/50
4,452,674 A * 6/1984 Gillich et al. ............... 205/317
4,566,952 A * 1/1986 Sprintschnik et al. .... 430/278.1
5,277,788 A * 1/1994 Nitowski et al. ........... 205/175
6,096,479 A * 8/2000 Kawamura et al. ...... 430/270.1
6,117,613 A * 9/2000 Kawauchi et al. ....... 430/270.1
6,120,618 A * 9/2000 Opalka ....................... 148/250
6,143,158 A * 11/2000 Nishino et al. ............. 205/219
6,764,587 B2 * 7/2004 Sawada et al. ............. 205/214
2002/0182538 A1 * 12/2002 Tomita et al. ........... 430/278.1
2003/0031860 A1 * 2/2003 Hotta et al. ................. 428/336

* cited by examiner

*Primary Examiner*—Amanda C. Walke
(74) *Attorney, Agent, or Firm*—Frishauf, Holtz, Goodman & Chick, P.C.

(57) ABSTRACT

Disclosed is a process for manufacturing an aluminum support for a light sensitive planographic printing plate material, the process comprising the steps of surface-roughening an aluminum plate, anodizing the surface-roughened aluminum plate, surface treating the anodized aluminum plate with an aqueous polyvinyl phosphonic acid solution, and drying the resulting plate at from 150 to 230° C. to obtain the aluminum support.

8 Claims, No Drawings

ALUMINUM SUPPORT FOR PLANOGRAPHIC PRINTING PLATE, ITS MANUFACTURING PROCESS, AND PLANOGRAPHIC PRINTING PLATE MATERIAL

This application is based on Japanese Patent Application No. 2004-123885 filed on Apr. 20, 2004 in Japanese Patent Office, the entire content of which is hereby incorporated by reference.

FIELD OF THE INVENTION

The present invention relates to a light sensitive planographic printing plate material (hereinafter also referred to as a printing plate material), an aluminum support for a light sensitive planographic printing plate material, and a manufacturing process of a planographic printing plate aluminum support.

BACKGROUND OF THE INVENTION

Recently, in a plate-making process of a printing plate for off-set printing, a CTP has been developed in which digital image data can be directly written in a light sensitive planographic printing plate material employing laser, and has been practically used.

Among them, a printing plate material comprising an aluminum support and provided thereon, an image formation layer are used in printing industries in which a relatively high printing durability is required.

As the aluminum support, an aluminum plate subjected to surface-roughening treatment and anodization treatment is generally used, however, when a large quantity of copies are printed employing a printing plate having such an aluminum plate, there are problems that a small dot image may be damaged or stain may occur at non-image portions.

As a printing plate material to solve the above problems, a printing plate material is proposed in for example, Japanese Patent O.P.I. Publication No. 2000-255177, which comprises a grained aluminum support, having protrusions with a specific average height consisting of boehmite on the surface, and provided thereon, a polymerizable light sensitive layer.

Known is a printing plate material comprising an aluminum support which is subjected to a specific surface-roughening treatment, anodization treatment, and then hydrophilization treatment employing polyvinyl phosphonic acid (see for example, Japanese Patent O.P.I. Publication No. 2002-103834), or a printing plate material comprising an aluminum support and a light sensitive layer, an intermediate layer containing polyvinyl phosphonic acid between the aluminum support and the light sensitive layer (see for example, Japanese Patent O.P.I. Publication No. 2002-57831). However, when a large quantity of copies are printed, there are some cases in the above printing plate material where a small dot image may be damaged or stain may occur at non-image portions. Therefore, the above printing plate material is not satisfactory in printing durability and anti-stain property.

SUMMARY OF THE INVENTION

An object of the invention is to provide a light sensitive planographic printing plate material providing high printing durability and excellent anti-stain property during printing, an aluminum support for the light sensitive planographic printing plate material, and a manufacturing process of the aluminum support.

The above object of the invention can be attained by the followings:

1. A process for manufacturing an aluminum support for a light sensitive planographic printing plate material, the process comprising the steps of surface-roughening an aluminum plate, anodizing the surface-roughened aluminum plate, surface treating the anodized aluminum plate with an aqueous polyvinyl phosphonic acid solution, and drying the resulting plate at from 150 to 230° C. to obtain the aluminum support.

2. The process for manufacturing of item 1 above, wherein the polyvinyl phosphonic acid has a number average molecular weight of from 5,000 to 40,000.

3. The process for manufacturing of item 1 above, wherein the aqueous polyvinyl phosphonic acid solution contains polyvinyl phosphonic acid in an amount of from 0.05 to 0.6% by weight.

4. The process for manufacturing of item 1 above, wherein the surface treating is carried out at 20 to 90° C. for 10 to 180 seconds.

5. The process for manufacturing of item 1 above, wherein the drying is carried out for 2 to 60 seconds.

6. The process for manufacturing of item 1 above, wherein the aluminum support has a polyvinyl phosphonic acid coverage of from 3 to 30 $mg/m^2$.

7. A process for manufacturing a light sensitive planographic printing plate material comprising an aluminum support and provided thereon, an image formation layer, the process comprising the steps of surface-roughening an aluminum plate, anodizing the surface-roughened aluminum plate, surface treating the anodized aluminum plate with an aqueous polyvinyl phosphonic acid solution, drying the resulting plate at from 150 to 230° C. to obtain the aluminum support, and providing the image formation layer on the resulting aluminum support.

8. The process of item 7 above, wherein the image formation layer is a thermosensitive image formation layer containing a compound capable of being decomposed by an acid, a polymerizable composition, or thermoplastic particles.

9. The process of item 7 above, wherein the image formation layer is a photopolymerizable image formation layer containing a polymerizable composition, the polymerizable composition containing a photopolymerization initiator.

10. The process for manufacturing of item 7 above, wherein the polyvinyl phosphonic acid has a number average molecular weight of from 5,000 to 40,000.

11. The process for manufacturing of item 7 above, wherein the aqueous polyvinyl phosphonic acid solution contains polyvinyl phosphonic acid in an amount of from 0.05 to 0.6% by weight.

12. The process for manufacturing of item 7 above, wherein the surface treating is carried out at 20 to 90° C. for 10 to 180 seconds.

13. The process for manufacturing of item 7 above, wherein the drying is carried out for 2 to 60 seconds.

14. The process for manufacturing of item 7 above, wherein the aluminum support has a polyvinyl phosphonic acid coverage of from 3 to 30 $mg/m^2$.

15. A light sensitive planographic printing plate material comprising a surface roughened and phosphonic acid surface treated aluminum support with a polyvinyl phosphonic acid coverage of from 3 to 30 $mg/m^2$, and provided thereon, an image formation layer, wherein the aluminum support is manufactured by the process of item 1 above.

The present invention will be explained in detail below.

The present invention is a manufacturing process of an aluminum support for a light sensitive planographic printing plate material comprising the steps of surface-roughening an aluminum plate, anodizing the surface-roughened aluminum plate, surface treating the anodized aluminum plate with an aqueous solution containing polyvinyl phosphonic acid, and then drying the resulting aluminum plate at a temperature of from 150 to 230° C.

(Aluminum Support)

An aluminum plate for the aluminum support of the invention is a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. Further, an aluminum plate manufactured by rolling can be used. A regenerated aluminum plate obtained by rolling aluminum regenerated from scrapped or recycled materials, which has recently spread, can be also used.

It is preferable that the aluminum plate for the aluminum support used in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting plate is preferably subjected to desmut treatment in an aqueous solution of an acid such as phosphoric acid, nitric acid, sulfuric acid, chromic acid, or a mixture thereof, since smut is produced on the surface of the support.

Subsequently, surface roughening treatment is carried out. As the surface roughening treatment, there are mechanical surface roughening treatment and electrolytic surface roughening treatment. In the invention, electrolytic surface roughening treatment is carried out in an electrolyte solution containing hydrochloric acid as a main component, employing an alternating current. However, prior to the electrolytic surface roughening treatment in the electrolyte solution containing hydrochloric acid, electrolytic surface roughening treatment may be carried out in an electrolyte solution containing nitric acid as a main component, or mechanical surface roughening treatment may be carried out.

Though there is no restriction for the mechanical surface roughening treatment, a brushing roughening method and a honing roughening method are preferable. The brushing roughening method is carried out by rubbing the surface of the plate with a rotating brush with a brush hair with a diameter of 0.2 to 0.8 mm, while supplying slurry in which volcanic ash particles with a particle size of 10 to 100 μm are dispersed in water to the surface of the plate. The honing roughening method is carried out by ejecting obliquely slurry with pressure applied from nozzles to the surface of the plate, the slurry containing volcanic ash particles with a particle size of 10 to 100 μm dispersed in water. Surface roughening can be also carried out by laminating the plate surface with a sheet on the surface of which abrading particles with a particle size of from 10 to 100 μm has been coated at intervals of 100 to 200 μm and at a density of 2.5 $\times 10^3$ to $10\times 10^3/cm^2$, and then applying pressure to the laminated sheet to transfer the roughened pattern of the sheet, whereby the plate surface is roughened.

After the plate has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous solution of alkali chemicals such as sodium hydroxide is preferably used. The dissolution amount of aluminum in the plate surface is preferably 0.5 to 5 $g/m^2$. After the plate has been dipped in the aqueous alkali solution, it is preferable for the plate to be dipped in an acid such as phosphoric acid, nitric acid, sulfuric acid and chromic acid, or in a mixed acid thereof, for neutralization.

In the electrolytic surface roughening treatment carried out in the electrolytic solution containing nitric acid, voltage applied is generally from 1 to 50 V, and preferably from 5 to 30 V. The current density used can be selected from the range from 10 to 200 $A/dm^2$, and is preferably from 20 to 100 $A/dm^2$. The quantity of electricity can be selected from the range of from 100 to 5000 $C/dm^2$, and is preferably 100 to 2000 $C/dm^2$. The temperature during the electrolytic surface roughening treatment may be in the range of from 10 to 50° C., and is preferably from 15 to 45° C. The nitric acid concentration in the electrolytic solution is preferably from 0.1 to 5% by weight. It is possible to optionally add, to the electrolytic solution, nitrates, chlorides, amines, aldehydes, phosphoric acid, chromic acid, boric acid, acetic acid, oxalic acid or aluminum salts.

After the plate has been subjected to electrolytic surface roughening treatment in the electrolytic solution containing nitric acid, it is preferably dipped in an acid or an aqueous alkali solution in order to remove abrasives and aluminum dust, etc. which have been embedded in the plate surface. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the plate surface is preferably 0.5 to 5 $g/m^2$. After the plate has been dipped in the aqueous alkali solution, it is preferable for the plate to be dipped in an acid such as phosphoric acid, nitric acid, sulfuric acid and chromic acid, or in a mixed acid thereof, for neutralization.

In the electrolytic surface roughening treatment carried out in the electrolytic solution containing hydrochloric acid employing alternating current, the hydrochloric acid concentration of the electrolytic solution is from 5 to 20 g/liter, and preferably from 6 to 15 g/liter. The current density used is in the range of from 15 to 120 $A/dm^2$, and preferably from 20 to 90 $A/dm^2$. The quantity of electricity is in the range of from 400 to 2000 $C/dm^2$, and preferably 500 to 1200 $C/dm^2$. The frequency of the alternating current is preferably from 40 to 150 Hz. The temperature during the electrolytic surface roughening treatment may be in the range of from 10 to 50° C., and is preferably from 15 to 45° C. It is possible to optionally add, to the electrolytic solution, nitrates, chlorides, amines, aldehydes, phosphoric acid, chromic acid, boric acid, acetic acid, oxalic acid or aluminum salts.

After the plate has been subjected to electrolytic surface roughening treatment in the electrolytic solution containing hydrochloric acid, it is preferably dipped in an acid or an aqueous alkali solution in order to remove aluminum dust, etc. produced in the plate surface. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, a phosphoric acid or sodium hydroxide aqueous solution is preferably used. The dissolution amount of aluminum in the plate surface is preferably 0.5 to 2 $g/m^2$. After the plate has been dipped in the aqueous alkali solution, it is preferable for the plate to be dipped in an acid such as phosphoric acid, nitric acid, sulfuric acid and chromic acid, or in a mixed acid thereof, for neutralization.

The surface-roughened aluminum plate has an average surface roughness (Ra) of preferably from 0.4 to 0.6 μm on the side, which is to be an image formation layer side. The surface roughness can be controlled by an appropriate combination of a hydrochloric acid concentration, current density and quantity of electricity.

After the surface roughening treatment, anodizing treatment is carried out. There is no restriction in particular for the method of anodizing treatment used in the invention, and known methods can be used. The anodizing treatment forms an anodization film on the plate surface. Generally, the anodizing treatment is carried out in an electrolyte solution containing sulfuric acid, phosphoric acid or their mixture applying a direct current. In the invention, the anodizing treatment is carried out preferably in a sulfuric acid solution. The sulfuric acid concentration of the sulfuric acid solution is preferably from 5 to 50% by weight, and more preferably from 10 to 35% by weight. The temperature of the sulfuric acid solution is preferably from 10 to 50° C. Voltage applied is preferably not less than 18 V, and more preferably not less than 20 V. Current density applied is preferably from 1 to 30 $A/dm^2$. Quantity of electricity is preferably from 100 to 600 $C/dm^2$.

The coated amount of the formed anodization film is suitably 1 to 50 $mg/dm^2$, and preferably 10 to 40 $mg/dm^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water. Micro pores are formed in the anodization film. The micro pore density in the anodization film is preferably from 400 to 700/$\mu m^2$, and more preferably from 400 to 600/$\mu m^2$.

The aluminum plate, which has been subjected to anodizing treatment, is optionally subjected to sealing treatment. For the sealing treatment, it is possible to use known methods using hot water, boiling water, steam, a sodium silicate solution, an aqueous dichromate solution, a nitrite solution and an ammonium acetate solution. Among these, the sodium silicate solution is especially preferred.

In the invention, that the anodized aluminum plate is surface treated with an aqueous solution containing polyvinyl phosphonic acid is that the anodized surface of the anodized aluminum plate is brought into contact with the aqueous polyvinyl phosphonic acid solution.

The polyvinyl phosphonic acid used in the invention is a vinyl polymer having a phosphon group, and having a number average molecular weight of preferably from 5,000 to 40,000, and more preferably from 10,000 to 25,000. The polyvinyl phosphonic acid content of the aqueous polyvinyl phosphonic acid solution is preferably from 0.05 to 0.6% by weight, and more preferably from 0.1 to 0.4% by weight.

A method for surface treating the aluminum plate with the aqueous polyvinyl phosphonic acid solution is not specifically limited. There is for example, a coating method, a spraying method, or a dipping method. The dipping method is preferred in that the facility is cheap. An aqueous polyvinyl phosphonic acid solution used in the dipping method is preferably an aqueous 0.1 to 0.4% by weight polyvinyl phosphonic acid solution. The surface treating temperature is preferably from 20 to 90° C., and the surface treating time is preferably from 10 to 180 seconds. After the surface treating, excessive polyvinyl phosphonic acid is removed from the aluminum plate surface preferably through washing or squeegeeing.

After that, the resulting aluminum plate is dried at from 150 to 230° C. The coverage of the polyvinyl phosphonic acid after drying is preferably from 3 to 30 $mg/m^2$, more preferably from 5 to 20 $mg/m^2$, and still more preferably from 8 to 15 $mg/m^2$.

That the surface treated aluminum plate is dried at from 150 to 230° C. is that the surface treated aluminum plate is dried at an aluminum plate surface temperature from 150 to 230° C. The aluminum surface temperature can be measured through a non-contact surface thermometer available on the market. As a heater for drying, there are, for example, a hot-air dryer, a quartz heater and a far infrared ray heater. The drying time of the surface treated aluminum plate is preferably from 2 to 60 seconds, and more preferably from 5 to 40 seconds. Thus, the aluminum support of the invention is obtained.

(Image Formation Layer)

The image formation layer in the invention is a layer capable of forming an image by imagewise exposure. As the image formation layer, a positive or negative working image formation layer used in a conventional light sensitive planographic printing plate material can be used.

As the image formation layer in the invention, a thermosensitive image formation layer or a photopolymerizable image formation layer is preferably used. As the thermosensitive image formation layer, a layer capable of forming an image employing heat generated due to laser exposure is preferred. As the layer capable of forming an image employing heat generated due to laser exposure, a positive working thermosensitive image formation layer containing a compound capable of being decomposed by an acid or a negative working image formation layer such as a thermosensitive image formation layer containing a polymerizable composition or a thermosensitive image formation layer containing thermoplastic particles are preferably used.

As the positive working image formation layer containing a compound capable of being decomposed by an acid, there is, for example, an image formation layer comprising a photolytically acid generating compound capable of generating an acid on laser exposure, an acid decomposable compound, which is decomposed by the generated acid to increase solubility to a developer, and an infrared absorber, as disclosed in Japanese Patent O.P.I. Publication Nos. 9-171254.

As the photolytically acid generating compound there are various conventional compounds and mixtures. For example, a salt of diazonium, phosphonium, sulfonium or iodonium ion with $BF_4^-$, $PF_6^-$, $SbF_6^-$ $SiF_6^{2-}$ or $ClO_4^-$, an organic halogen containing compound, o-quinonediazide sulfonylchloride or a mixture of an organic metal and an organic halogen-containing compound is a compound capable of generating or releasing an acid on irradiation of an active light, and can be used as the photolytically acid generating compound in the invention. The organic halogen-containing compound known as an photoinitiator capable of forming a free radical is a compound capable of generating a hydrogen halide and can be used as the photolytically acid generating compound. The examples of the organic halogen containing compound capable of forming a hydrogen halide include those disclosed in U.S. Pat. Nos. 3,515,552, 3,536,489 and 3,779,778 and West German Patent No. 2,243,621, and compounds generating an acid by photodegradation disclosed in West German Patent No. 2,610,842. As the photolytically acid generating compound, o-naphthoquinone diazide-4-sulfonylhalogenides disclosed in Japanese Patent O.P.I. Publication No. 50-30209 can be also used.

As the photolytically acid generating compound, an organic halogen-containing compound is preferred in view of sensitivity to infrared rays and storage stability. The organic halogen-containing compound is preferably a halogenated alkyl-containing triazines or a halogenated alkyl-containing oxadiazoles, and especially preferably a halogenated alkyl-containing s-triazines.

The content of the photolytically acid generating compound in the image formation layer is preferably 0.1 to 20% by weight, and more preferably 0.2 to 10% by weight based on the total weight of the solid components of the image formation layer, although the content broadly varies depending on its chemical properties, or kinds or physical properties of image formation layer used.

As the acid decomposable compound, there are a compound having a C—O—C bond disclosed in Japanese Patent O.P.I. Publication Nos. 48-89003, 51-120714, 53-133429, 55-12995, 55-126236 and 56-17345, a compound having an Si—O—C bond disclosed in Japanese Patent O.P.I. Publication Nos. 60-37549 and 60-121446, another acid decomposable compound disclosed in Japanese Patent O.P.I. Publication Nos. 60-3625 and 60-10247, a compound having an Si—N bond disclosed in Japanese Patent O.P.I. Publication No. 62-222246, a carbonic acid ester disclosed in Japanese Patent O.P.I. Publication No. 62-251743, an orthocarbonic acid ester disclosed in Japanese Patent O.P.I. Publication No. 62-209451, an orthotitanic acid ester disclosed in Japanese Patent O.P.I. Publication No. 62-280841, an orthosilicic acid ester disclosed in Japanese Patent O.P.I. Publication No. 62-280842, an acetal or ketal disclosed in Japanese Patent O.P.I. Publication No. 63-10153 and a compound having a C—S bond disclosed in Japanese Patent O.P.I. Publication No. 62-244038. Of these compounds, the compound having a C—O—C bond, the compound having an Si—O—C bond, the orthocarbonic acid ester, the acetal or ketal or the silylether disclosed in Japanese Patent O.P.I. Publication Nos. 53-133429, 56-17345, 60-121446, 60-37549, 62-209451 and 63-10153 are preferable.

The content of the acid decomposable compound in the image formation layer is preferably 5 to 70% by weight, and more preferably 10 to 50% by weight based on the total weight of the solid components of the image formation layer. The acid decomposable compounds may be used alone or as an admixture of two or more kinds thereof.

The image formation layer in the invention preferably contains a light-to-heat conversion material which is capable of changing exposure light to heat. Examples of the light-to-heat conversion material include a light-to-heat conversion dye and a light-to-heat conversion compound, each described below.

Light-to-heat Conversion Dye

Examples of the light-to-heat conversion dye include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversion materials include those disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination. Those described in Japanese Patent O.P.I. Publication Nos. 11-240270, 11-265062, 2000-309174, 2002-49147, 2001-162965, 2002-144750, and 2001-219667 can be preferably used.

Light-to-heat Conversion Compound

Examples of the light-to-heat conversion compound include carbon, graphite, a metal and a metal oxide.

Furnace black and acetylene black is preferably used as the carbon. The graininess ($d_{50}$) thereof is preferably not more than 100 nm, and more preferably not more than 50 nm.

The graphite is one having a particle size of preferably not more than 0.5 μm, more preferably not more than 100 nm, and most preferably not more than 50 nm.

As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used. Examples of the former include black iron oxide and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. These oxides are particles having a particle size of not more than 0.5 μm, preferably not more than 100 nm, and more preferably not more than 50 nm.

As these light-to-heat conversion compounds, black iron oxide or black complex metal oxides containing at least two metals are more preferred.

Examples of the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light heat conversion efficiency as compared with another metal oxide.

The primary average particle size of these complex metal oxides is preferably from 0.001 to 1.0 μm, and more preferably from 0.01 to 0.5 μm. The primary average particle size of from 0.001 to 1.0 μm improves a light heat conversion efficiency relative to the addition amount of the particles, and the primary average particle size of from 0.05 to 0.5 μm further improves a light heat conversion efficiency relative to the addition amount of the particles. The light heat conversion efficiency relative to the addition amount of the particles depends on a dispersity of the particles, and the well-dispersed particles have a high light heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of the complex metal oxide particles.

The content of the light-to-heat conversion material in the thermosensitive image formation layer is preferably from 0.5 to 15% by weight, and more preferably from 1 to 5% by weight.

The image formation layer optionally contains a binder.

As a positive working image formation layer, an image formation layer containing o-naphthoquinone is preferably used.

The light-to-heat conversion material described above may be contained in the image formation layer or in a layer adjacent thereto.

As the thermosensitive image formation layer containing a polymerizable composition described above, there is a thermosensitive image formation layer containing a light-to-heat conversion material (a) having an absorption band in a wavelength region of from 700 to 1300 nm, a polymerization initiator (b) and a polymerizable unsaturated compound (c). (Light-to-heat conversion material (a) having an absorption band in a wavelength region of from 700 to 1300 nm)

As the light-to-heat conversion material (a) having an absorption band in a wavelength region of from 700 to 1300 nm, There are the infrared absorbing dyes described above. Preferred are dyes such as cyanine dyes, squalirium dyes, oxonol dyes, pyrylium dyes, thiopyrylium dyes, polymethine dyes, oil soluble phthalocyanine dyes, triarylamine dyes, thiazolium dyes, oxazolium dyes, polyaniline dyes, polypyrrole dyes and polythiophene dyes.

Besides the above, pigments such as carbon black, titanium black, iron oxide powder, and colloidal silver can be preferably used. Cyanine dyes as dyes, and carbon black as pigments are especially preferred, in view of extinction coefficient, light-to-heat conversion efficiency and cost.

The content of the light-to-heat conversion material (a) in the thermosensitive image formation layer containing a polymerizable composition is preferably from 0.5 to 15% by weight and more preferably from 1 to 5% by weight. Further, the content of the light-to-heat conversion material in the image formation layer is different due to extinction coefficient of the light-to-heat conversion material, but is preferably an amount giving a reflection density of from 0.3 to 3.0, and preferably from 0.5 to 2.0. For example, in order to obtain the above reflection density, the content of the cyanine dye in the image formation layer is 10 to 100 mg/$m^2$.

This light-to-heat conversion material also may be contained in the image formation layer or in a layer adjacent thereto.

Polymerization Initiator (b)

The photopolymerization initiator is a compound capable of initiating polymerization of an unsaturated monomer by laser. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No. 1,459,563.

Typical examples of the photopolymerization initiator include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis(dimethylamino)benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I. Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344.

Furthermore, the following are cited as an example of a polymerization initiator.

Compounds which can generate a radical disclosed in JP-A 2002-537419; polymerization initiators disclosed in Japanese Patent O.P.I. Publication Nos. 2001-175006, 2002-278057, and 2003-5363; onium salts which have two or more cation sections in the molecule disclosed in Japanese Patent O.P.I. Publication No. 2003-76010, N-nitrosamine compounds disclosed in Japanese Patent O.P.I. Publication No. 2001-133966; compounds which generate a radical with heat disclosed in Japanese Patent O.P.I. Publication No.

2001-343742, compounds which generate an acid or a radical with heat disclosed in JP-A No. 2002-6482; borates described in JP-A No. 2002-116539; compounds which generate an acid or a radical with heat disclosed in Japanese Patent O.P.I. Publication No. 2002-148790; photolytic or thermal polymerization initiators which have an unsaturated group of the polymerizable disclosed in Japanese Patent O.P.I. Publication No. 2002-207293; onium salts which have an anion of divalence or more as a counter ion disclosed in Japanese Patent O.P.I. Publication No. 2002-268217; sulfonyl sulfone compounds having a specified structure disclosed in Japanese Patent O.P.I. Publication No. 2002-328465; and compounds which generate a radical with heat disclosed in Japanese Patent O.P.I. Publication No. 2002-341519.

Especially preferable compounds are an onium salt and a poly halogenated compound.

The following are cited as the onium salt.

Diazonium salts disclosed in S. I. Schlesinger, Photogr. Sci. Eng., 18, 387 (1974), T. S. Bal et al., Polymer, 21, 423 (1980); ammonium salts disclosed in U.S. Pat. Nos. 4,069,055, 4,069,056, 4,027,992; phosphonium salts disclosed in D.C. Necker et al., Macromolecules, 17, 2468 (1984), C. S. Wen et al., The, Proc. Conf. Rad. Curing ASIA, p478, Tokyo, Oct (1988), U.S. Pat. Nos. 4,069,055 and 4,069,056; iodonium salts disclosed in J. V. Crivello et al., Macromorecules, 10 (6), 1307 (1977), Chem.& amp, Eng. News, November 28, p 31 (1988), E.P. No. 104,143, and U.S. Pat. Nos. 339,049, 410,201, Japanese Patent O.P.I. Publication Nos. 2-150848 and 2-296514; sulfonium salts disclosed in J. V. Crivello et al., Polymer J. 17, 73(1985), J. V. Crivello et al., J. Org. Chem., 43, 3055(1978), W. R. Watt et al., J. Polymer Sci., Polymer Chem. Ed., 22, 1789(1984), J. V. Crivello et al., Polymer Bull., 14, 279(1985), J. V. Crivello et al., Macromorecules, 14(5), 1141(1981), J. V. Crivello et al., J. Polymer Sci., Polymer Chem. Ed., 17, 2877(1979), EP Nos. 370,693, 3,902,114, 233, 567, 297, 443, 297,442, U.S. Pat. Nos. 4,933,377, 161,811, 410,201, 339,049, 4,760,013, 4,734,444, 2,833,827, DP Nos. 2,904,626, 3,604,580, and 3,604,581; selenonium salts disclosed in J. V. Crivello et al., Macromorecules, 10 (6), 1307 (1977), J. V. Crivello et al., J. Polymer Sci., and Polymer Chem. Ed., 17, 1047 (1979); and ammonium salts disclosed in C. S. Wen et al., Teh, Proc. Conf. Rad. Curing ASIA, p. 478 Tokyo, Oct (1988).

Among the above onium salts, iodonium salts and sulfonium salts are especially preferred.

The preferred examples of the sulfonium salts are as follows:

Triphenylsulfonium tetrafluoroborate, methyldiphenyl sulfonium tetrafluoroborate, dimethylphenylsulfonium hexafluorophosphate, 4-butoxyphenyldiphenylsulfonium tetrafluoroborate, 4-chlorophenyldiphenylsulfonium hexafluorophosphate, tri(4-phenoxylphenyl)sulfonium hexafluorophosphate, di(4-ethoxyphenyl)methylsulfonium hexafluoroarsenate, 4-acetonyl phenyldiphenylsulfonium tetrafluoroborate, 4-thiomehoxyphenyl diphenylsulfonium hexafluorophosphate, di(methoxysulfonylphenyl)methylsulfonium hexafluoroantimonate, di(nitrophenyl)phenylsulfonium hexafluoroantimonate, di(carbomethbxyphenyl)methylsulfonium hexafluorophosphate, 4-acetamidophenyldiphenylsulfonium tetrafluoroborate, dimethylnaphthylsulfonium hexafluorophosphate, trifluoromethyldiphenylsulfonium tetrafluoroborate, p-(phenyl thiophenyl)diphenylsulfonium hexafluoroantimonate, 10-methyl phenoxathiinium hexafluorophosphate, 5-methylthianthrenium hexafluorophosphate, 10-phenyl-9,9-dimethylthioxanthenium hexafluorophosphate, triphenylsulfonium tetrakis (pentafluorophenyl)borate.

The preferred examples of the iodonium salts are as follows:

Diphenyliodonium iodide, diphenyliodonium hexafluoroantimonate, 4-chlorophenyliodonium tetrafluoroborate, di(4-chlorophenyl)iodonium hexafluoroantimonate, diphenyliodonium hexafluorophosphate, diphenyliodonium trifluoroacetate, 4-trifluoromethylphenyl iodonium tetrafluoroborate, diphenyliodonium hexafluoroaresenate, ditolyliodonium hexafluorophosphate, di(4-methoxyphenyl) iodonium hexafluoroantimonate, di(4-methoxy phenyl)iodonium chloride, phenyl(4-methylphenyl) iodonium tetrafluoroborate, di(2,4-dimethyl phenyl) iodonium hexafluoroantimonate, di(4-t-butylphenyl)iodonium hexafluoroantimonate, 2,2'-diphenyliodonium hexafluorophosphate, tolylcumyl diphenyliodonium tetrakis(pentafluorophenyl)borate.

A polyhalogenated compound is a compound containing a trihalogenomethyl group, dihalogenomethyl group or a dihalogenomethylene group in the molecule. Preferable examples are halogenated compounds represented by the following Formula (1) and an oxadiazole compound with the above-described halogenated groups. Among these, a polyhaloacetyl compound represented by formula (2) is especially preferred.

$$R^1—CY_2—(C=O)—R^2 \qquad \text{Formula (1)}$$

wherein $R^1$ represents a hydrogen atom, a halogen atom, an alkyl group, an aryl group, an acyl group, an alkylsulfonyl group, an arylsulfonyl group, an iminosulfonyl group or a cyano group; $R^2$ represents a monovalent substituent, provided that $R^1$ and $R^2$ may combine with each other to form a ring; and Y represents a halogen atom.

$$CY_3—(C=O)—X—R^3 \qquad \text{Formula (2)}$$

wherein $R^3$ represents a monovalent substituent; X represents —O— or —$NR^4$—, in which $R^4$ represents a hydrogen atom or an alkyl group, provided that $R^3$ and $R^4$ may combine with each other to form a ring; and Y represents a halogen atom. Among these, a compound having a polyhalogenated acetylamido group is preferably used. A compound having an oxadiazole ring with a polyhalogenated methyl group is also preferably used.

The content of the polymerization initiator in the thermosensitive image formation layer is not specifically limited, but is preferably from 0.1 to 20% by weight, and more preferably from 0.8 to 15% by weight.

(Polymerizable Unsaturated Compound (c))

The polymerizable unsaturated compound is a compound having a polymerizable unsaturated group. Examples thereof include conventional radically polymerizable monomers, and polyfunctional monomers and polyfunctional oligomers each having plural ethylenically unsaturated bond ordinarily used in UV-curable resins.

The polymerizable unsaturated compound is not specifically limited, but preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexyl acrylate, or 1,3-dioxolanyl acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ϵ-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ϵ-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ϵ-caprolactone adduct, pyrrogallol triacrylate, propionic acid dipentaerythritol triacrylate, propionic acid dipentaerythritol tetraacrylate, hydroxypivalylaldehyde modified dimethylolpropane triacrylate or EO-modified products thereof; and a methacrylate, itaconate, crotonate or maleate alternative of the above polyfunctional acrylate.

A prepolymer can be used as described above, and the prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin-(meth)acrylic acid or phenol novolak.epichlorhydrin.(meth)acrylic acid obtained by incorporating (meth)acrylic acid in an epoxy resin; an urethane-acrylate such as ethylene glycol.adipic acid.tolylenediisocyanate.2-hydroxyethylacrylate, polyethylene glycol.tolylenediisocyanate .2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The image formation layer can contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

As a monomer used in combination in the image formation layer, there is a phosphate compound having at least one (meth)acryloyl group. The phosphate compound is a compound having a (meth)acryloyl group in which at least one hydroxyl group of phosphoric acid is esterified.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of “11290 Chemical Compounds” edited by Kagakukogyo Nipposha, and compounds described on pages 11 to 65 of “UV.EB Koka Handbook (Materials)” edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, a polymerizable unsaturated compound having a tertiary amino group in the molecule can be used preferably. The monomer is not specifically limited to the chemical structure, but is preferably a hydroxyl group-containing tertiary amine modified with glycidyl methacrylate, methacrylic acid chloride or acrylic acid chloride. Typically, a polymerizable compound is preferably used which is disclosed in Japanese Patent O.P.I. Publication Nos. 1-203413 and 1-197213.

In the invention, a reaction product of a tertiary amine having two or more hydroxyl groups in the molecule, a diisocyanate and a compound having a hydroxyl group and an addition polymerizable ethylenically double bond in the molecule is preferably used. A compound having a tertiary amino group and an amide bond in the molecule is especially preferred.

The tertiary amine having two or more hydroxyl groups in the molecule has a hydroxyl group of preferably from 2 to 6, and more preferably from 2 to 4. Examples of the tertiary amine having two or more hydroxyl groups in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N, N',N'-tetra-2-hydroxypropylethylenediamine, p-tolyldiethanolamine, N,N, N',N'-tetra-2-hydroxyethylethylenediamine, N,N-bis (2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethyl-cyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule is not specifically limited, but 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate are preferred.

The reaction product can be synthesized according to the same method as a conventional method in which a urethaneacrylate compound is ordinarily synthesized employing a diol, a diisocyanate and an acrylate having a hydroxyl group.

Examples of the reaction product of a tertiary amine having two or more hydroxyl groups in the molecule, a diisocyanate having an aromatic ring in the molecule and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

M-6: A reaction product of triethanolamine (1 mole), 1,3-bis(1-isocyanato-1-methylethyl)benzene (3 moles), and 2-hydroxyethyl methacrylate (3 moles)

M-7: A reaction product of ethylenediamine tetraethanol (1 mole), 1,3-bis(1-isocyanato-1-methylethyl)benzene (4 moles), and 2-hydroxyethyl methacrylate (4 moles)

In addition to the above, acrylates or methacrylates disclosed in Japanese Patent O.P.I. Publication Nos. 2-105238 and 1-127404 can be used.

The polymerizable unsaturated compound content of the image formation layer is preferably from 5 to 80% by weight, and more preferably from 5 to 60% by weight.

The thermosensitive image formation layer in the invention comprising the polymerizable composition described above preferably contains an alkali soluble polymer.

The alkali soluble polymer is a polymer having a specific acid value, and as typical examples thereof, the following polymer having various structure can be preferably used.

For example, a polymer having a hydroxyl group or a carboxyl group is preferably used, and a polymer having a carboxyl group is more preferably used.

Among these is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-)hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenyl-methacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluorbpentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer.

An unsaturated bond-containing copolymer, which is obtained by reacting the polymer having a carboxyl group with for example, a compound having a (meth)acryloyl group and an epoxy group, is also preferred.

Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

Of the above alkali soluble polymers, those having an acid value of from 30 to 200 are preferred, and those having an acid value of from 50 to 150 are more preferred. Of these, those having a weight average molecular weight of from 15,000 to 500,000 are preferred, and those having a weight average molecular weight of from 20,000 to 100,000 are more preferred.

Of the above polymers, those having a polymerizable unsaturated group are preferred, and those having 5 to 50 mol % of the polymerizable unsaturated group as a repeating unit are especially preferred.

An alkali soluble polymer having a polymerizable unsaturated group can be synthesized according to a conventional method without any limitations.

For example, a method can be used which reacts a carboxyl group with a glycidyl group, or reacts a hydroxyl group with an isocyanate group.

Typically, the alkali soluble polymer is a reaction product obtained by reacting a copolymer having a carboxyl group-containing monomer unit with an aliphatic epoxy-containing unsaturated compound such as allyl glycidyl ether, glycidyl (meth)acrylate, α-ethylglycidyl(meth)acrylate, glycidyl crotonate, glycidyl isocrotonate, crotonyl glycidyl ether, itaconic acid monoalkylmonoglycidyl ester, fumaric acid monoalkylmonoglycidyl ester, or maleic acid monoalkylmonoglycidyl ester; or an alicyclic epoxy-containing unsaturated compound such as 3,4-epoxycyclohexylmethyl (meth)acrylate. In the invention, when an amount of the carboxyl group reacted with the epoxy-containing unsaturated compound is represented in terms of mol %, The amount is preferably from 5 to 50 mol %, and more preferably from 10 to 30 mol % in view of sensitivity and printing durability.

Reaction of a copolymer having a carboxyl group-containing monomer unit with a compound having an epoxy group and an unsaturated group is carried out for example, at 80 to 120° C. for 1 to 50 hours. The reaction product can be synthesized according to a conventional polymerization method, for example, a method described in literatures such as W. R. Sorenson & T. W. Cambell "Kobunshi Gosei Jikkenho" published by TOKYO KAGAKU DOHJIN, or Japanese Patent O.P.I. Publication Nos. 10-315598 and 11-271963, or a method similar to the above.

The content of the alkali soluble polymer in the image formation layer is preferably from 10 to 90% by weight, more preferably from 15 to 70% by weight, and still more preferably from 20 to 50% by weight.

Examples of the copolymer having a carboxyl group-containing monomer unit described above include a copolymer having at least one selected from units derived from the following monomers (1) through (17):

(1) A monomer having an aromatic hydroxy group;
(2) A monomer having an aliphatic hydroxy group;
(3) A monomer having an aminosulfonyl group;
(4) A monomer having a sulfonamido group;
(5) An α,β-unsaturated carboxylic acid;
(6) A substituted or unsubstituted alkyl acrylate;
(7) A substituted or unsubstituted alkyl acrylate;
(8) Acrylamide or methacrylamide;
(9) A monomer having a fluorinated alkyl group;
(10) A vinyl ether;
(11) A vinyl ester;
(12) A styrene;
(13) A vinyl ketone;
(14) An olefin;
(15) N-vinylpyrrolidone, N-vinylcarbazole, or N-vinylpyridine;
(16) A monomer having a cyano group; and
(17) A monomer having an amino group.

Typical examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexyl acrylate, or 1,3-dioxolanyl acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

(Another Polymer Binder)

The image formation layer in the invention can contain another polymer binder.

Examples of another polymer binder include a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These polymer binder can be used as an admixture of two or more thereof.

(Polymerization Inhibitor)

The image formation layer in the invention can optionally a polymerization inhibitor. As the polymerization inhibitor, there is for example, a hindered amine with a base dissociation constant (pKb) of from 7 to 14 having a piperidine skeleton.

The polymerization inhibitor content is preferably from 0.001 to 10% by weight, more preferably from 0.01 to 10% by weight, and still more preferably from 0.1 to 5% by weight based on the total solid content of polymerizable unsaturated group-containing compound in the image formation layer.

The thermosensitive image formation layer in the invention may contain a second polymerization inhibiter other than the above-described polymerization inhibiter. Examples of the second polymerization inhibiter include hydroquinone, p-methoxyphenol, di-t-butyl-p-cresol, pyrrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The thermosensitive image formation layer can contain a colorant. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". As the colorant, there are pigments.

As kinds of the pigments, there are black pigment, yellow pigment, red pigment, brown pigment, violet pigment, blue pigment, green pigment, fluorescent pigment, and metal powder pigment. Typical examples of the pigments include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment). Among these pigments, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of image formation layer.

(Coating)

Solvents used in the preparation of the coating liquid for the thermosensitive image formation layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl-cyclohexanone; and an ester such as ethyl lactate, butyl lactate, diethyl oxalate, or methyl benzoate.

The coating liquid for the thermosensitive image formation layer is coated on a support according to a conventional method, and dried to obtain a light sensitive planographic printing plate material. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of a coated thermosensitive image formation layer is preferably from 60 to 160° C., more preferably from 80 to 140° C., and still more preferably from 90 to 120° C.

In the invention, a protective layer is preferably provided on the thermosensitive image formation layer. It is preferred that the protective layer (oxygen shielding layer) is highly soluble in a developer as described later (generally an alkaline solution). The protective layer preferably contains polyvinyl alcohol and polyvinyl pyrrolidone. Polyvinyl alcohol has the effect of preventing oxygen from transmitting and polyvinyl pyrrolidone has the effect of increasing adhesion between the oxygen shielding layer and the image formation layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

A coating liquid for the protective layer is obtained by dissolving the materials described above in a solvent. The coating liquid is coated on the light sensitive layer and dried to form a protective layer. The dry thickness of the protective layer is preferably from 0.1 to 5.0 μm, and more preferably from 0.5 to 3.0 μm. The protective layer may contain a surfactant or a matting agent.

The same coating method as described above in the image formation layer applies in the protective layer coating method. The drying temperature of the protective layer is preferably lower than that of the image formation layer. The former is preferably not less than 10° C. lower than that of the latter, and more preferably not less than 20° C. lower than that of the latter. Further, the drying temperature of the protective layer is preferably lower than a glass transition temperature (Tg) of the binder contained in the image formation layer. The drying temperature of the protective layer is preferably not less than 20° C. lower than Tg of the binder contained in the image formation layer, and more preferably not less than 40° C. lower than Tg of the binder contained in the image formation layer. The drying temperature of the protective layer is preferably at most 60° C. lower than Tg of the binder contained in the image formation layer.

The photopolymerizable image formation layer in the invention is an image formation layer containing a polymerization initiator and a polymerizable unsaturated compound. As the polymerization initiator and polymerizable unsaturated compound, the same as those used in the thermosensitive image formation layer containing a polymerizable composition described above can be used.

As a photopolymerization initiator in the photopolymerizable image formation layer, a titanocene compound, a triarylmonoalkylborate compound, an iron-arene complex or a trihaloalkyl compound is preferably used.

As the titanocene compounds, there are compounds disclosed in Japanese Patent O.P.I. Publication Nos. 63-41483 and 2-291. Preferred examples thereof include bis(cyclopentadienyl)-Ti-dichloride, bis(cyclopentadienyl)-Ti-bisphenyl, bis(cyclopentadienyl)-Ti-bis-2,3,4,5,6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,4-difluorophenyl (IRUGACURE 727L, produced by Ciba Specialty Co., Ltd.), bis(cyclopentadienyl)-bis(2,6-difluoro-3-(pyry-1-yl)phenyl) titanium (IRUGACURE 784, produced by Ciba Specialty Co., Ltd.), bis(cyclopentadienyl)-bis(2,4,6-trifluoro-3-(pyry-1-yl)phenyl) titanium, and bis (cyclopentadienyl)-bis(2,4,6-trifluoro-3-(2,5-dimethylpyry-1-yl)phenyl) titanium.

As the monoalkyltriaryl borate compounds, there are those described in Japanese Patent O.P.I. Publication Nos. 62-150242 and 62-143044. Preferred examples of the monoalkyl-triaryl borate compounds include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

As the iron arene complexes, there are those described in Japanese Patent O.P.I. Publication No. 59-219307. Preferred examples of the iron arene complex include η-benzene-(η-cyclopentadienyl)iron.hexafluorophosphate, η-cumene)-(η-cyclopentadienyl)iron.hexafluorophosphate, η-fluorene-(η-cyclopentadienyl)iron.hexafluorophosphate, η-naphthalene-(η-cyclopentadienyl)iron.hexafluorophosphate, η-xylene-(η-cyclopentadienyl)iron.hexafluorophosphate, and η-benzene-(η-cyclopentadienyl)iron.hexafluoroborate.

As the trihaloalkyl compound, the trihaloalkyl compound described above can be used. Any other polymerization initiator can be also used in combination.

As the polymerization initiator, there are, for example, cumarin derivatives B-1 through B-22 disclosed in Japanese Patent O.P.I. Publication No. 8-129258, cumarin derivatives D-1 through D-32 disclosed in Japanese Patent O.P.I. Publication No. 2003-121901, cumarin derivatives 1 through 21 disclosed in Japanese Patent O.P.I. Publication No. 2002-363206, cumarin derivatives 1 through 40 disclosed in Japanese Patent O.P.I. Publication No. 2002-363207, cumarin derivatives 1 through 34 disclosed in Japanese Patent O.P.I. Publication No. 2002-363208, and cumarin derivatives 1 through 56 disclosed in Japanese Patent O.P.I. Publication No. 2002-363209.

The photopolymerizable image formation layer can contain the polymer binder described above as a polymer binder. The photopolymerizable image formation layer preferably contains a photosensitizer.

(Additives)

In the invention, the photopolymerizable image formation layer in the invention may contain a hindered phenol compound, a hindered amine compound or other polymerization inhibitors in addition to the compounds described above, in order to prevent undesired polymerization of the ethylenically unsaturated monomer during the manufacture or storage of the light sensitive planographic printing plate material.

Examples of the hindered phenol compound include 2,6-di-t-butyl-p-cresol, butylhydroxyanisole, 2,2'-methylenebis(4-methyl-6-t-butylphenol), 4,4'-butylidenebis(3-methyl-6-t-butylphenol), tetrakis[methylene-3-(3',5'-t-butyl-4'-hydroxyphenyl)-propionate]methane, bis[3,3'-bis(4'-hydroxy-3'-t-butylphenyl)butyric acid]glycol ester, 2-t-butyl-6-(3-t-butyl-2-hydroy-5-methylbenzyl)-4-methylphenyl acrylate, and 2-[1-(2-hydroxy-3,5-di-t-pentylphenyl)ethyl]-4,6-di-t-pentylphenyl acrylate. Among them, 2-t-butyl-6-(3-t-butyl-2-hydroy-5-methylbenzyl)-4-methylphenyl acrylate and 2-[1-(2-hydroxy-3,5-di-t-pentylphenyl)ethyl]-4,6-di-t-pentylphenyl acrylate, each having a (meth)acryloyl group, are preferred.

Examples of the hindered amine compound include bis(1,2,2,6,6-pentamethyl-4-piperidyl)sebacate, bis(2,2,6,6-tetramethyl-4-piperidyl)sebacate, 1-[2-{3-(3,5-di-t-butyl-hydroxyphenyl)propionyloxy}ethyl]-4-[2-{3-(3,5-di-t-butyl-hydroxyphenyl)propionyloxy}ethyl]-2,2,6,6-tetramethylpiperidine, 4-benzoyloxy-2,2,6,6-tetramethylpiperidine, and 8-acetyl-3-dodecyl-7,7,9,9-tetramethyl-1,3,8-triazaspiro-[4. 5]decane-2,4-dione.

Examples of another polymerization inhibitor include hydroquinone, p-methoxyphenol, di-t-butyl-p-cresol, pyrrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt, and hindered amines such as 2,2,6,6-tetramethylpiperidine derivatives -butyl-6-(3-t-butyl-6-hydroxy-5-mrthylbenzyl)-4-methylphenyl acrylate.

The polymerization inhibitor content is preferably 0.01 to 5% by weight based on the total solid content of the photopolymerizable image formation layer. Further, in order to prevent polymerization induced by oxygen, a higher fatty acid such as behenic acid or a higher fatty acid derivative such as behenic amide may be added to the light sensitive layer, or may be localized on the surface of the light sensitive layer in the course of drying after coating. The higher fatty acid or higher fatty acid derivative content is preferably 0.5 to 10% by weight based on the total solid content of the image photopolymerizable formation layer.

The photopolymerizable image formation layer can further contain the colorant as described above in the thermosensitive image formation layer.

(Coating)

Solvents used in the preparation of the coating liquid for the photopolymerizable image formation layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The coating liquid for the photopolymerizable image formation layer is coated on a support according to a conventional method, and dried to obtain a light sensitive planographic printing plate material. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of a coated photopolymerizable image formation layer is preferably from 60 to 160° C., more preferably from 80 to 140° C., and still more preferably from 90 to 120° C.

(Protective Layer)

A protective layer is preferably provided on the photopolymerizable image formation layer in the invention. It is preferred that the protective layer (oxygen shielding layer) is highly soluble in a developer (generally an alkaline solution).

Materials constituting the protective layer are preferably polyvinyl alcohol, polysaccharide, polyvinyl pyrrolidone, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide. These materials may be used alone or in combination. Especially preferred material is polyvinyl alcohol.

A coating liquid for the protective layer is obtained by dissolving the materials described above in a solvent. The coating liquid is coated on the light sensitive layer and dried to form a protective layer. The dry thickness of the protective layer is preferably from 0.1 to 5.0 μm, and more preferably from 0.5 to 3.0 μm. The protective layer may contain a surfactant or a matting agent.

The same coating method as described above in the image formation layer applies in the protective layer coating method. The drying temperature of the protective layer is preferably lower than that of the image formation layer. The former is preferably not less than 10° C. lower than that of the latter, and more preferably not less than 20° C. lower than that of the latter. Further, the drying temperature of the protective layer is preferably lower than a glass transition temperature (Tg) of the binder contained in the image formation layer. The drying temperature of the protective layer is preferably not less than 20° C. lower than Tg of the binder contained in the image formation layer, and more preferably not less than 40° C. lower than Tg of the binder contained in the image formation layer. The drying temperature of the protective layer is preferably at most 60° C. lower than Tg of the binder contained in the image formation layer.

(Plate-making and Printing)

The light sensitive planographic printing plate material of the invention is imagewise exposed to form an image, and then optionally developed to obtain a printing plate which is applied for printing.

The light sources for the imagewise exposure include, for example, a laser, an emission diode, a xenon flush lamp, a halogen lamp, a carbon arc light, a metal halide lamp, a tungsten lamp, a high pressure mercury lamp, and a non-electrode light source.

When the light sensitive planographic printing plate precursor is imagewise exposed at one time, a mask material having a negative image pattern made of a light shielding material is provided on the image formation layer to be in close contact with the image formation layer, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder, and the method of scanning on an inner surface of a cylinder are preferred in optical system accuracy and high density recording.

When the exposed light sensitive planographic printing plate material is developed, an automatic developing machine is ordinarily used. Printing is carried out employing a conventional printing press.

In recent years, printing ink containing no petroleum volatile organic compound (VOC) has been developed and used in view of environmental concern. The present invention provides excellent effects in employing such a printing ink. Examples of such a printing ink include soybean oil ink "Naturalith 100" produced by Dainippon Ink Kagaku Kogyo Co., Ltd., VOC zero ink "TK HIGH ECO NV" produced by Toyo Ink Manufacturing Co., Ltd., and process ink "Hicelvo" produced by Tokyo Ink Co., Ltd.

EXAMPLES

Next, the present invention will be explained employing examples, but the present invention is not limited thereto. In the examples, "parts" represents "parts by weight", unless otherwise specified.

Examples 1 Through 16 and Comparative Examples 1 Through 8

Preparation of Supports for Planographic Printing Plate

Preparation of Support A

A 0.24 mm thick aluminum plate (JIS 1050) was degreased at 50° C. for 10 seconds in a 5% sodium hydroxide solution, washed with water, immersed at 25° C. for 10 seconds in a 10% nitric acid solution to neutralize, and then washed with water.

The resulting aluminum plate was electrolytically surface roughened at 25° C. for 30 seconds at a current density of 30 A/dm$^2$ in an electrolyte solution containing 11 g/l of hydrochloric acid, 12 g/l of acetic acid, and 1.5 g/l of aluminum 10% sodium hydroxide solution, immersed at 20° C. for 10 seconds in a 1% sodium hydroxide solution, immersed at 25° C. for 10 seconds in a 10% nitric acid solution for neutralizing, and then washed with water.

The resulting plate was anodized in a 25° C. 20% sulfuric acid aqueous solution at a current density of 5 A/dm$^2$ for 40 seconds, to obtain an anodization film with a thickness of 2.5 g/m$^2$, and washed with water. Subsequently, the aluminum plate is immersed in an aqueous 2% solution of polyvinyl phosphonic acid (with a number average molecular weight of 21,000) at 70° C. for 30 seconds, washed with water, and dried at from 50 to 230° C. Thus, support A was prepared.

Preparation of Support B

Support B was prepared in the same manner as in support A above, except that in the electrolytically surface roughening, the aluminum plate was surface roughened for 15 seconds. (Drying conditions in preparation of each support are shown in Table 1.)

(Measurement of Polyvinyl Phosphonic Acid Coverage)

Intensity of fluorescent X-rays of phosphor on the support surface was measured employing a scanning fluorescent X-ray analyzer ZSX-100e (produced by Rigaku Denki Kogyo Co., Ltd.), and the polyvinyl phosphonic acid coverage was determined by a calibration curve obtained from a sample having a known coverage of polyvinyl phosphonic acid.

The supports A and B had a polyvinyl phosphonic acid coverage of 10 mg/m$^2$.

(Measurement of an Average Surface Roughness)

The support surface was scanned at a scanning speed of 0.05 mm/second and at a scanning length of 8 mm, employing SE 1700α produced by Kosaka Kenkyuusho, wherein a stylus having a tip diameter of 2 μm was used. The average surface roughness of the support was determined according to JIS B0601 2001.

Light Sensitive Planographic Printing Plate Material and Planographic Printing Plate (Preparation of Light Sensitive Planographic Printing Plate Material Sample C)

Composition of an Image Formation Layer C (Positive Working Light Sensitive Layer) Coating Liquid for Infrared Laser Exposure)

| | |
|---|---|
| Novolak resin (described below) | 8.0 parts |
| Ketal compound (described below) | 2.0 parts |
| 1,3-Bis (trichloromethyl)-5-methyl-s-triazine | 0.1 parts |
| Infrared absorbing dye (described below) | 0.1 parts |
| Cyano group-containing resin (described below) | 1.0 part |
| 2-Butanone | 54.0 parts |
| Propylene glycol monomethyl ether | 36.0 parts |

Novolak resin: Condensation product (Mw = 4,000) of a mixture of m-cresol, p-cresol and phenol (60/35/5) with formaldehyde Cyano group-containing resin: Copolymer (Mw = 20,000) of methacrylonitrile, 4-hydroxyphenylmaleimide, methyl methacrylate (30:20:50)

Ketal compound

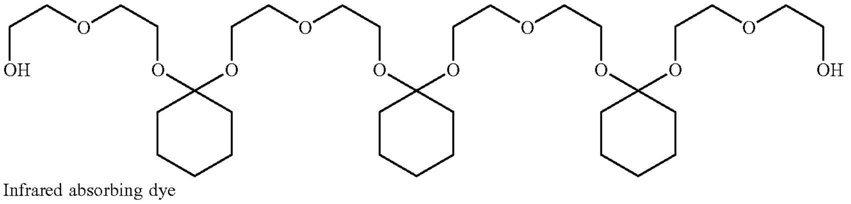

Infrared absorbing dye

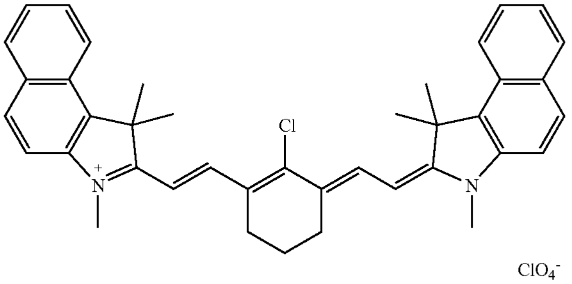

Then, the above light sensitive layer coating liquid was coated on each of the supports A and B through a wire bar, and dried at 95° C. for 1.5 minutes to give image formation layer C having a dry thickness of 1.5 g/$m^2$. Thus, a light sensitive planographic printing plate material sample C was prepared.

(Preparation of Planographic Printing Plate Sample)

The resulting light sensitive planographic printing plate material C was inagewise exposed to infrared laser, and developed in a developer (a six-fold dilute solution of a PS plate developer DR-1 produced by Mitsubishi Kagaku Co., Ltd.) at 30° for 20 seconds to dissolve an image formation layer at exposed portions Thus, a planographic printing plate sample was obtained. Herein, exposure energy necessary to completely dissolve an image formation layer at exposed portions was 125 mJ/$cm^2$, where an image formation layer at unexposed portions corresponding to image portions was not dissolved by the development, and a clear image was obtained. (Supports used are shown in Table 1.)

(Preparation of Light Sensitive Planographic Printing Plate Material Sample D)

Composition of Image Formation Layer D (Photopolymerizable Image Formation Layer) Coating Liquid 1

| | |
|---|---|
| Polymer binder B-1 (described below) | 40.0 parts |
| Sensitizing dye (described below) | 3.0 parts |
| Photopolymerization initiator (described below) | 4.0 parts |
| Addition polymerizable ethylenically unsaturated monomer (described below) | 40.0 parts |

-continued

| | |
|---|---|
| NK ESTER G (polyethylene glycol dimethacrylate produced by Shinnakamura Kagaku Co., Ltd.) | 15.0 parts |
| Hindered amine compound (LS-770 produced by Sankyo Co., Ltd.) | 2.5 parts |
| Trihaloalkyl compound (described below) | 5.0 parts |
| Phthalocyanine pigment (MHI #454 produced by Mikuni Sikisosha) | 6.0 parts |
| Fluorine-contained surfactant (F-178K produced by Dainippon Ink Kagaku Kogyo Co., Ltd.) | 0.5 parts |
| Methyl ethyl ketone | 80 parts |
| Cyclohexanone | 820 parts |
| (Synthesis of polymer binder B-1) | |

One hundred and twenty-five parts (1.25 mol) of methyl methacrylate, 12 parts (0.1 mol) of ethyl methacrylate, 63 parts (0.73 mol) of metha-crylic acid, 240 parts of cyclohexanone, 160 parts of isopropyl alcohol, and 5 parts of α,α'-azobisisobutyro-nitrile were put in a three neck flask under nitrogen atmosphere, and reacted under nitrogen atmosphere for 6 hours at 80° C. in an oil bath. After that, 4 parts of triethylbenzylammonium chloride and 52 parts (0.73 mol) of glycidyl methacrylate were further added to the mixture, and reacted at 25° C. for 3 hours. Thus, polymer binder B-1 was obtained. The weight average molecular weight of the polymer binder B-1 was 55,000 (in terms of polystyrene), measured according to GPC.

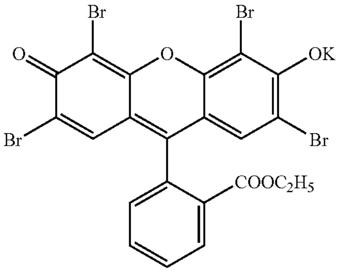

Sensitizing dye

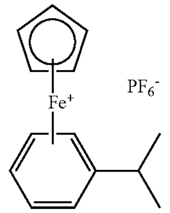

Photopolymerization initiator

Addition Polymerizable Unsaturated Compound

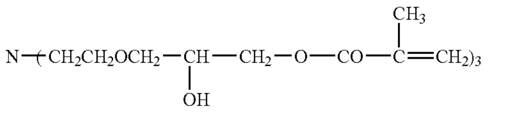

Trihaloalkyl Compound

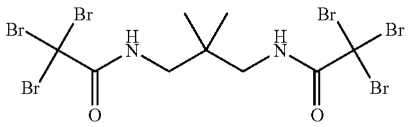

(Protective Layer Coating Liquid)

| | |
|---|---|
| Polyvinyl alcohol (GL-05, produced by Nippon Gosei Kagaku Co., Ltd.) | 89 parts |
| Water-soluble polyamide (P-70, produced by Toray Co., Ltd.) | 10 parts |
| Surfactant (Surfinol 465, produced by Nisshin Kagaku Kogyo Co., Ltd.) | 0.5 parts |
| Water | 900 parts |

Then, the above photopolymerizable image formation layer coating liquid 1 was coated on each of the supports A and B through a wire bar, and dried at 95° C. for 1.5 minutes to give image formation layer D having a dry thickness of 1.5 $g/m^2$. After that, the protective layer coating liquid was coated on the image formation layer D using an applicator, and dried at 75° C. for 1.5 minutes to give a protective layer with a dry thickness of 2.0 $g/m^2$. Thus, a light sensitive planographic printing plate material sample D with a protective layer was prepared. (Supports used are shown in Table 1.)

(Preparation of Planographic Printing Plate Sample)

The photopolymerizable light sensitive planographic printing plate material sample D obtained above was imagewise exposed at a resolution of 2400 dpi ("dpi" means a dot number per 1 inch, i.e., 2.54 cm), employing a CTP exposure device Tigercat (produced by ECRM Co., Ltd.), in which a FD-YAG laser was installed.

Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the protective layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, a planographic printing plate sample was obtained. Herein, preheating was carried out at a surface temperature of 115° C. for 15 seconds. Time taken from completion of exposure till to arrival at the preheating section was within 60 seconds.

| <Developer composition> | |
|---|---|
| Potassium silicate solution (containing 26% by weight of $SiO_2$ and 13.5% by weight of $K_2O$) | 40.0 g/liter |
| Potassium hydroxide | 4.0 g/liter |
| Ethylenediaminetetraacetic acid | 0.5 g/liter |
| Sodiumsulfo-polyoxyethylene (13) naphthyl ether | 20.0 g/liter |

Water was added to make a 1 liter developer. PH of the developer was 12.3.

(Preparation of Light Sensitive Planographic Printing Plate Material Sample E)

Light sensitive planographic printing plate material sample E with a protective layer was prepared in the same manner as in light sensitive planographic printing plate material sample D above, except that the following photopolymerizable image formation layer coating liquid 2 was used instead of photopolymerizable image formation layer coating liquid 1 to form an image formation layer E with a dry thickness of 1.5 $g/m^2$. (Supports used are shown in Table Composition of Image Formation Layer E (Photopolymerizable Image Formation Layer) Coating Liquid 2

| | |
|---|---|
| Polymer binder B-1 (described above) | 40.0 parts |
| Sensitizing dye A (described below) | 1.5 parts |
| Sensitizing dye B (described below) | 1.5 parts |
| Photopolymerization initiator (described above) | 4.0 parts |
| Addition polymerizable ethylenically unsaturated monomer (described above) | 40.0 parts |
| NK ESTER G (polyethylene glycol dimethacrylate produced by Shinnakamura Kagaku Co., Ltd.) | 15.0 parts |
| Hindered amine compound (LS-770 produced by Sankyo Co., Ltd.) | 2.5 parts |
| Trihaloalkyl compound (described above) | 5.0 parts |
| Phthalocyanine pigment (MHI #454 produced by Mikuni Sikisosha) | 6.0 parts |

-continued

| | |
|---|---|
| Fluorine-contained surfactant (F-178K produced by Dainippon Ink Kagaku Kogyo Co., Ltd.) | 0.5 parts |
| Methyl ethyl ketone | 80 parts |
| Cyclohexanone | 820 parts |

Sensitizing dye A

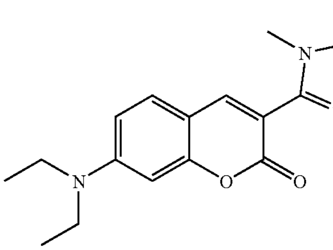

Sensitizing dye B

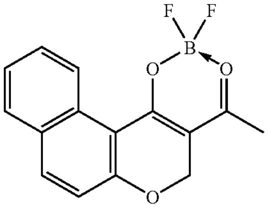

(Preparation of Planographic Printing Plate Sample)

Light sensitive planographic printing plate material sample E obtained above was processed in the same manner as in light sensitive planographic printing plate material sample D, except that a plate setter Tigercat (produced by ECRM Co., Ltd.), in which a 408 nm laser with an output power of 30 mW was installed, was used for exposure. Thus, a planographic printing plate sample was obtained.

(Preparation of Light Sensitive Planographic Printing Plate Material Sample F)

Composition of Image Formation Layer F (Negative Working Thermally Photopolymerizable Image Formation Layer) Coating Liquid

| | |
|---|---|
| Addition polymerizable ethylenically unsaturated monomer 1 | 20.0 parts |
| Addition polymerizable ethylenically unsaturated monomer 2 | 20.0 parts |
| Addition polymerizable ethylenically unsaturated monomer 3 | 10.0 parts |
| Trihaloalkyl compound (described above) | 5.0 parts |
| Cyanine dye 1 (described below) | 2.5 parts |
| Acryl copolymer 1 (described below) | 40.0 parts |
| N-phenylglycine benzyl ester | 4.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenyl acrylate (Sumirizer GS: produced by Sumitomo 3M Co., Ltd.) | 0.5 parts |
| Fluorine-contained surfactant (F-178K produced by Dainippon Ink Kagaku Kogyo Co., Ltd.) | 0.5 parts |
| Methyl ethyl ketone | 80 parts |
| Cyclohexanone | 820 parts |

(Synthesis of Acryl Copolymer 1)

Thirty parts of methacrylic acid, 50 parts of methyl methacrylate, 20 parts of ethyl methacrylate, 250 parts of isopropyl alcohol, 250 parts of propylene glycol monomethyl ether acetate, and 3 parts of α,α'-azobisisobutyronitrile were placed in a three neck flask under nitrogen atmosphere, reacted under nitrogen atmosphere for 6 hours at 80° C. in an oil bath, and further refluxed at a boiling point of isopropyl alcohol for one hour. After that, 3 parts of triethylbenzylammonium chloride and 25 parts of glycidyl methacrylate were further added to the reaction mixture, and reacted for 3 hours. Thus, acryl copolymer 1 was obtained. The weight average molecular weight of acryl copolymer 1 was 35,000 (in terms of polystyrene), measured according to GPC, and the glass transition point (Tg) of acryl copolymer 1 was 85° C., measured according to DSC (differential scanning calorimetry)

Addition polymerizable unsaturated compound 1: A reaction product of n-butyldiethanolamine (1 mole), tetramethylxylylene diisocyanate (2 moles), and 1-methacryloyloxy-3-acryloyloxy-2-propanol (2 moles)

Addition polymerizable unsaturated compound 2: A reaction product of hexane-1,6-diisocyanate (1 mole), and 2-hydroxypropylene-1,3-dimethacrylate (2 mole)

Addition polymerizable unsaturated compound 3: Tetraethylene glycol dimethacrylate Cyanine dye 1

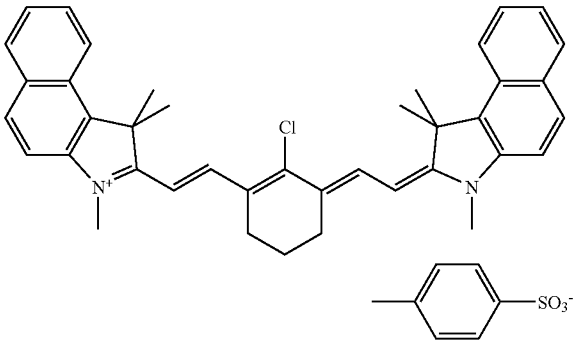

The above negative working thermal photopolymerizable image formation layer coating liquid was coated on each of the supports A and B through a wire bar, and dried at 95° C. for 1.5 minutes to give image formation layer F having a dry thickness of 1.5 $g/m^2$. Thus, a light sensitive planographic printing plate material sample F was prepared.

(Preparation of Planographic Printing Plate Sample)

Employing a plate setter Trend Setter 3244 (produced by Creo Co., Ltd.), in which a 830 nm light source was installed, the light sensitive planographic printing plate material sample F obtained above was imagewise exposed at 2400 dpi. Subsequently, the exposed sample was subjected to development treatment employing a CTP automatic developing machine (Raptor Themal produced by Glunz & Jensen Co., Ltd.) to obtain a planographic printing plate sample. Herein, the developing machine comprised a development section charged with a developer described below, a washing section for removing the developer remaining on the developed sample after development, and a gumming section charged with a gumming solution (a solution obtained by diluting GW-3, produced by Mitsubishi Chemi cal Co., Ltd., with water by a factor of 2) for protecting the surface of the developed sample.

| <Composition of developer (aqueous solution containing the following components)> | |
|---|---|
| Potassium silicate aqueous solution (containing 25.5-27.5% by weight of $SiO_2$ and 12.5-14.5% by weight of $K_2O$) | 8.0% by weight |
| Newcol B-13SN (produced by Nippon Nyukazai Co., Ltd.) | 3.0% by weight |
| Potassium hydroxide | amount giving pH 12.3 |

Combination of Support and Image Formation Layer

As described above, light sensitive planographic printing plate material samples having a different combination of support and image formation layer were prepared. The combination of support and image formation layer is shown in Table 1. In Table 1, two kinds of heat sources, a hot-air dryer and a quartz heater, which were used for obtaining the supports A and B, are also shown.

In the hot-air drying, a preliminarily dried aluminum plate, a K thermoelectric couple being provided on the surface, was placed in a hot air dryer, and heated. After intended temperature was reached in the dryer, time during which the plate was maintained at the intended temperature is shown in Table 1. Time necessary to reach intended temperature was within 10 seconds.

In the quartz heater drying, a preliminarily dried aluminum plate, a K thermoelectric couple being provided on the surface, was placed under the quartz heater and heated. After intended temperature was reached in the heater, time during which the plate was maintained at the intended temperature is shown in Table 1. Time necessary to reach intended temperature was within 10 seconds.

Evaluation

1) Printing Durability

Employing the resulting printing plate sample, printing was carried out on a press (DAIYA1F-1 produced by Mitsubishi Jukogyo Co., Ltd.), wherein coated paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. A printing cycle was repeated, in which when 500 sheets were printed, printing was stopped, and the printing plate surface was wiped with a sponge impregnated with a plate cleaner (UPC, available from Nikken Kagaku Co., Ltd.), and printing was restarted. The number (lowest) of printing cycles in which dot reduction of 3% dot area at highlight portions was observed was evaluated as a measure of printing durability. The more the cycles are, the higher the printing durability.

2) Anti-stain Property

Employing the resulting printing plate sample, printing was carried out on a press (DAIYA1F-1 produced by Mitsubishi Jukogyo Co., Ltd.), wherein coated paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. After 30,000 sheets were printed, and the blanket of the press was cleaned, printing was restarted to obtain 10,000 copies. Ten thousandth copy was observed and evaluated according to the following criteria:

The results are shown in Table 1.

As is apparent from Table 1, the inventive light sensitive planographic printing plate material samples employing the support manufactured according to the manufacturing process of the invention provide high chemical resistance, high printing durability and excellent anti-stain property during printing.

TABLE 1

| Printing plate No. | Support No. | Drying temperature ° C. (drying time seconds) Hot-air dryer | Quartz heater | Image formation layer | Printing durability (Cycle number) | Anti-stain property |
|---|---|---|---|---|---|---|
| Ex. 1 | A | | 150 (20) | C | 15 | B |
| Ex. 2 | A | | 150 (20) | D | 58 | B |
| Ex. 3 | A | | 150 (20) | E | 62 | B |
| Ex. 4 | A | | 150 (20) | F | 35 | B |
| Ex. 5 | A | 200 (5) | | C | 17 | A |
| Ex. 6 | A | 220 (10) | | D | 70 | A |
| Ex. 7 | A | 180 (30) | | E | 65 | A |
| Ex. 8 | A | 200 (15) | | F | 40 | A |
| Ex. 9 | B | | 150 (30) | C | 16 | B |
| Ex. 10 | B | | 180 (60) | D | 62 | B |
| Ex. 11 | B | | 230 (10) | E | 70 | A |
| Ex. 12 | B | | 200 (60) | F | 45 | A |
| Ex. 13 | B | 150 (20) | | C | 15 | B |
| Ex. 14 | B | 150 (20) | | D | 58 | B |
| Ex. 15 | B | 150 (20) | | E | 60 | B |
| Ex. 16 | B | 150 (20) | | F | 37 | B |
| Comp. Ex. 1 | A | | 50 (120) | C | 10 | B |
| Comp. Ex. 2 | A | | 100 (30) | D | 45 | B |
| Comp. Ex. 3 | A | | 130 (60) | E | 47 | B |
| Comp. Ex. 4 | A | | 250 (5) | F | 50 | C |
| Comp. Ex. 5 | B | 50 (120) | | C | 10 | B |
| Comp. Ex. 6 | B | 100 (30) | | D | 46 | B |
| Comp. Ex. 7 | B | 250 (60) | | E | 48 | C |
| Comp. Ex. 8 | B | 130 (5) | | F | 19 | B |

Ex.: Example, Invention.,
Comp. Ex: Comparative Example

What is claimed is:

1. A process for manufacturing a light sensitive planographic printing plate material comprising an aluminum support and provided thereon, a positive working image formation layer, the process comprising the steps of:

(a) surface-roughening an aluminum plate;

(b) anodizing the surfaceroughened aluminum plate;

(c) surface treating the anodized aluminum plate with an aqueous polyvinyl phosphonic acid solution;

(d) drying the resulting plate at from 150 to 230° C. to obtain the aluminum support, wherein the aluminum support has a polyvinyl phosphonic acid coverage of from 3 to 30 mg/m$^2$; and (e) providing a positive working image formation layer on the resulting aluminum support, wherein the positive working image formation layer comprises a photolytically acid generating compound, an acid decomposable compound, and an infrared absorber.

2. The process for manufacturing of claim 1, wherein the polyvinyl phosphonic acid has a number average molecular weight of from 5,000 to 40,000.

3. The process for manufacturing of claim 1, wherein the aqueous polyvinyl phosphonic acid solution contains polyvinyl phosphonic acid in an amount of from 0.05 to 0.6% by weight.

4. The process for manufacturing of claim 1, wherein the surface treating is carried out at 20 to 90° C. for 10 to 180 seconds.

5. The process for manufacturing of claim 1, wherein the drying is carried out for 2 to 60 seconds.

6. A light sensitive planographic printing plate material comprising a surface roughened and polyvinyl phosphonic acid surface treated aluminum support with a polyvinyl phosphonic acid coverage of from 3 to 30 $mg/m^2$, and provided thereon, a positive working image formation layer comprising a photolytically acid generating compound, an acid decomposable compound, and an infrared absorber, wherein the light sensitive planographic printing plate material is manufactured by the process of claim 1.

7. The light sensitive planographic printing plate material of claim 6, wherein the photolytically acid generating compound is an organic halogen-containing compound, the acid decomposable compound is a compound having a C—O—C bond ox a Si—C—C bond, and the infrared absorber is selected from the group consisting of a cyanine dye, a chloconium dye, a polymethine dye, an azulenium dye, a squalenium dye, a thiopyrylium dye, a naphthoquinone dye or an anthraquinone dye, a phthalocyanine compound, a naphthalocyanine compound, an azo compound, a thioamide compound, a dithiol compound and an indoaniline compound.

8. The process for manufacturing of claim 1, wherein the photolytically acid generating compound is an organic halogen-containing compound, the acid decomposable compound is a compound having a C—O—C bond or a Si—O—C bond, and the infrared absorber is selected from the group consisting of a cyanine dye, a chloconium dye, a polymethine dye, an azulenium dye, a squalenium dye, a thiopyrylium dye, a naphthoquinone dye, an anthraquinone dye, a phthalocyanine compound, a naphthalocyanine compound, an azo compound, a thioamide compound, a dithiol compound and an indoaniline compound.

* * * * *